(12) United States Patent
Kaneko et al.

(10) Patent No.: US 7,885,065 B2
(45) Date of Patent: Feb. 8, 2011

(54) FAN MOTOR APPARATUS AND ELECTRONIC APPARATUS

(75) Inventors: Sachiko Kaneko, Chba (JP); Yuji Shishido, Kanagawa (JP); Takashi Mochida, Chiba (JP); Hideo Niikura, Tokyo (JP); Atsushi Kikuchi, Chiba (JP); Makoto Chiyoda, Kanagawa (JP)

(73) Assignee: Sony Corporation, Tokyo (JP)

( * ) Notice: Subject to any disclaimer, the term of this patent is extended or adjusted under 35 U.S.C. 154(b) by 115 days.

(21) Appl. No.: 12/017,675

(22) Filed: Jan. 22, 2008

(65) Prior Publication Data

US 2008/0180911 A1      Jul. 31, 2008

(30) Foreign Application Priority Data

Jan. 25, 2007   (JP) ............................. 2007-015134

(51) Int. Cl.
H05K 7/20      (2006.01)
(52) U.S. Cl. .................. 361/695; 361/679.48; 415/108; 415/119; 415/213.1
(58) Field of Classification Search ............ 361/679.34, 361/694, 695, 679.48; 415/208.5, 209.1, 415/200, 213.1, 119; 417/354, 16; 165/121; 310/67 R, 88
See application file for complete search history.

(56) References Cited

U.S. PATENT DOCUMENTS

| | | | |
|---|---|---|---|
| 4,568,243 A | 2/1986 | Schubert et al. | |
| 6,745,149 B2 * | 6/2004 | Beeten | 702/132 |
| 7,189,053 B2 * | 3/2007 | Winkler et al. | 415/108 |
| 7,255,529 B2 * | 8/2007 | Ku et al. | 415/119 |
| 7,312,991 B2 * | 12/2007 | Lee et al. | 361/695 |
| 2007/0140836 A1 * | 6/2007 | Chao et al. | 415/119 |
| 2007/0160458 A1 * | 7/2007 | Yen | 415/119 |
| 2008/0175705 A1 * | 7/2008 | Liu | 415/119 |

FOREIGN PATENT DOCUMENTS

| | | |
|---|---|---|
| JP | 50-45702 | 8/1975 |
| JP | 58-72700 | 4/1983 |
| JP | 05-316683 | 11/1993 |
| JP | 08-326842 | 12/1996 |
| JP | 2000-209809 | 7/2000 |
| JP | 2000-232750 | 8/2000 |
| JP | 2001-145300 | 5/2001 |

(Continued)

OTHER PUBLICATIONS

Japanese Office Action issued on Dec. 9, 2008, corresponding to JP Patent Appl. No. 2007-015134.

(Continued)

*Primary Examiner*—Jayprakash N Gandhi
*Assistant Examiner*—Courtney Smith
(74) *Attorney, Agent, or Firm*—SNR Denton US LLP

(57) ABSTRACT

Provided is a fan motor apparatus. The fan motor apparatus includes a rotor and a stator. The rotor includes a blade. The stator includes a rotor supporting mechanism, a supporting member, and a vibration insulation member. The rotor supporting mechanism rotatably supports the rotor. The supporting member supports the rotor supporting mechanism. The vibration insulation member is provided between the rotor supporting mechanism and the supporting member. The stator is capable of regulating relative movement of the rotor supporting mechanism and the supporting member.

6 Claims, 16 Drawing Sheets

FOREIGN PATENT DOCUMENTS

| | | |
|---|---|---|
| JP | 2003-269395 | 9/2003 |
| JP | 2005-086967 | 3/2005 |
| JP | 2005-171646 | 6/2005 |
| JP | 2005-240423 | 9/2005 |

OTHER PUBLICATIONS

Japanese Office Action issued on May 19, 2009 in connection with JP Application No. 2007-015134.

Japanese Patent Office Action corresponding to Japanese Serial No. 2007-015134 dated Apr. 6, 2010.

* cited by examiner

FAN MOTOR APPARATUS AND ELECTRONIC APPARATUS

CROSS REFERENCES TO RELATED APPLICATIONS

The present invention contains subject matter related to Japanese Patent Application JP 2007-015134 filed in the Japanese Patent Office on Jan. 25, 2007, the entire contents of which being incorporated herein by reference.

BACKGROUND OF THE INVENTION

1. Field of the Invention

The present invention relates to a fan motor apparatus releasing heat from a heat generator and to an electronic apparatus mounted with the fan motor apparatus.

2. Description of the Related Art

In the past, there is disclosed a fan including a vibration preventing section (refer to, for example, Japanese Patent Application Laid-open No. Sho 58-72700; FIG. 1, FIG. 2, and FIG. 5). The fan (10) includes an outer frame (52), an inner frame (54), and a vibration-preventing expandable film (56). The expandable film (56) connects the outer frame (52) and the inner frame (54). The outer frame (52), the inner frame (54), and the expandable film (56) constitute a device (50). A housing (12) is fixed to the device (50) with a bolt (45). The housing (12) includes a propeller (18). The expandable film (56) is made of a rubber material such as elastomer.

As shown in FIG. 5 and FIG. 6 of Japanese Patent Application Laid-open No. Sho 58-72700, the expandable film (56) of the fan (10) has a bellows shape. So the expandable film (56) may not curb vibration due to rotation of the propeller (18). In addition, in the case that the housing (12) receives a large impact from the outside, the housing (12) is caused to move. In this case, there is a fear that the housing (12) collides with a member, a device, and so force disposed in the vicinity of the fan (10).

SUMMARY OF THE INVENTION

In view of the above, the present invention relates to a technique for curbing vibration due to rotation of a rotor and for preventing a member included in a fan motor apparatus from colliding with another member or device even in the case that the fan motor apparatus receives an impact or the like.

In view of the above, according to an embodiment of the present invention, there is provided a fan motor apparatus. The fan motor apparatus includes a rotor and a stator. The rotor includes a blade. The stator includes a rotor supporting mechanism, a supporting member, and a vibration insulation member. The rotor supporting mechanism rotatably supports the rotor. The supporting member supports the rotor supporting mechanism. The vibration insulation member is provided between the rotor supporting mechanism and the supporting member. The stator is capable of regulating relative movement of the rotor supporting mechanism and the supporting member.

According to this embodiment, the vibration insulation member can prevent vibration from transmitting from the rotor supporting mechanism to the supporting member. Further, since the stator regulates the relative movement of the rotor supporting mechanism and the supporting member, the rotor supporting mechanism or the supporting member is prevented from colliding with another member or device even in the case that the fan motor apparatus receives an impact.

The term "relative movement of the rotor supporting mechanism and the supporting member" refers to movement due to a cause other than vibration which generates during rotation of the rotor, i.e., application of a force from the outside with respect to the fan motor apparatus as descried above. Hereinafter, the movement may sometimes be simply referred to as "relative movement".

According to another embodiment of the present invention, the stator includes a first rib and a second rib. The first rib is provided to the rotor supporting mechanism and has an end portion being a first tapered surface. The second rib is provided to the supporting member and has an end portion being a second tapered surface. The second tapered surface opposes the first tapered surface. The vibration insulation member is a tube-shaped member connecting the end portion of the first rib and the end portion of the second rib. Since the second tapered surface opposes the first tapered surface, the relative movement is regulated particularly in the direction in which the second tapered surface opposes the first tapered surface. Further, the tube-shaped vibration insulation member covers the end portion of the first rib and the end portion of the second rib. That is, a mechanism for regulating the relative movement is disposed inside the vibration insulation member. The fan motor apparatus can thus be downsized.

According to another embodiment of the present invention, the first rib is elastically provided to the rotor supporting mechanism. Accordingly, the first rib is allowed to move somewhat. Owing to this structure, when the fan motor apparatus is manufactured, an operator can readily connect the first rib and the second rib with the vibration insulation member. Alternatively, the second rib may be elastically provided to the supporting member.

According to another embodiment of the present invention, the stator includes a first rib and a second rib. The first rib is provided to the rotor supporting mechanism and includes a first engagement portion. The second rib is provided to the supporting member and includes a second engagement portion. The second engagement portion engages with the first engagement portion. In this embodiment, since the first rib engages with the second rib, the relative movement is further reliably regulated.

According to another embodiment of the present invention, the vibration insulation member is a tube-shaped member connecting the first rib and the second rib such that the first engagement portion and the second engagement portion are covered. Since the tube-shaped vibration insulation member covers the first engagement portion and the second engagement portion, the fan motor apparatus can be downsized as described above. Also in this embodiment, the first rib may be elastically provided to the rotor supporting mechanism. Alternatively, the second rib may be elastically provided to the supporting member.

According to another embodiment of the present invention, the stator includes a first rib and a second rib. The first rib is provided to the rotor supporting mechanism and has an end portion. The second rib is provided to the supporting member and has an end portion. The end portion of the second rib is connected to the end portion of the first rib through the vibration insulation member. The vibration insulation member is provided such that a gap formed between the end portion of the first rib and the end portion of the second rib is sealed. In this embodiment, since the first engagement portion engages with the second engagement portion and the vibration insulation member is provided such that the gap is sealed, vibration is absorbed and the relative movement of the rotor supporting mechanism and the supporting member can be regulated.

According to an embodiment of the present invention, there is provided an electronic apparatus. The electronic apparatus includes a heat generator, a fan motor, and a case. The fan motor includes a rotor and a stator. The rotor includes a blade. The stator includes a rotor supporting mechanism, a supporting member, and a vibration insulation member. The rotor supporting mechanism rotatably supports the rotor. The supporting member supports the rotor supporting mechanism. The vibration insulation member is provided between the rotor supporting mechanism and the supporting member. The stator is capable of regulating relative movement of the rotor supporting mechanism and the supporting member. The case accommodates therein the heat generator and the fan motor.

As described above, according to each embodiment of the present invention, vibration due to rotation of the rotor can be curbed, and a member included in the fan motor apparatus is prevented from colliding with another member or device even in the case that the fan motor apparatus receives an impact.

BRIEF DESCRIPTION OF DRAWINGS

The invention will become more fully understood from the following detailed description, taken in conjunction with the accompanying drawings, wherein similar reference numerals denote similar elements, in which.

DESCRIPTION OF PREFERRED EMBODIMENTS

Referring to the accompanying drawings, preferred embodiments of the present invention will be described.

Figure 1:
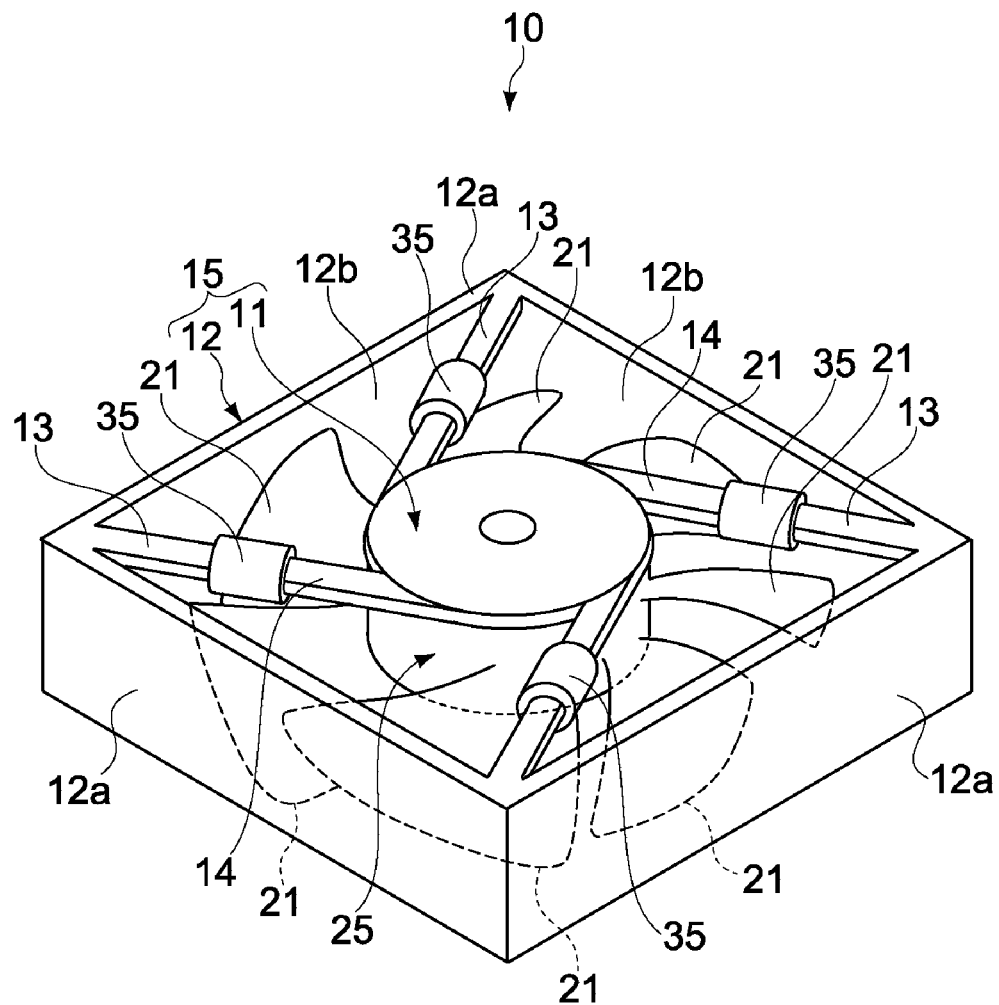
FIG. 1 is a perspective view showing a fan motor apparatus according to an embodiment of the present invention.
Figure 1:
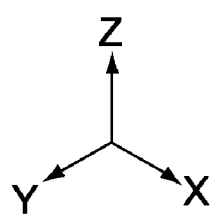
Figure 2:
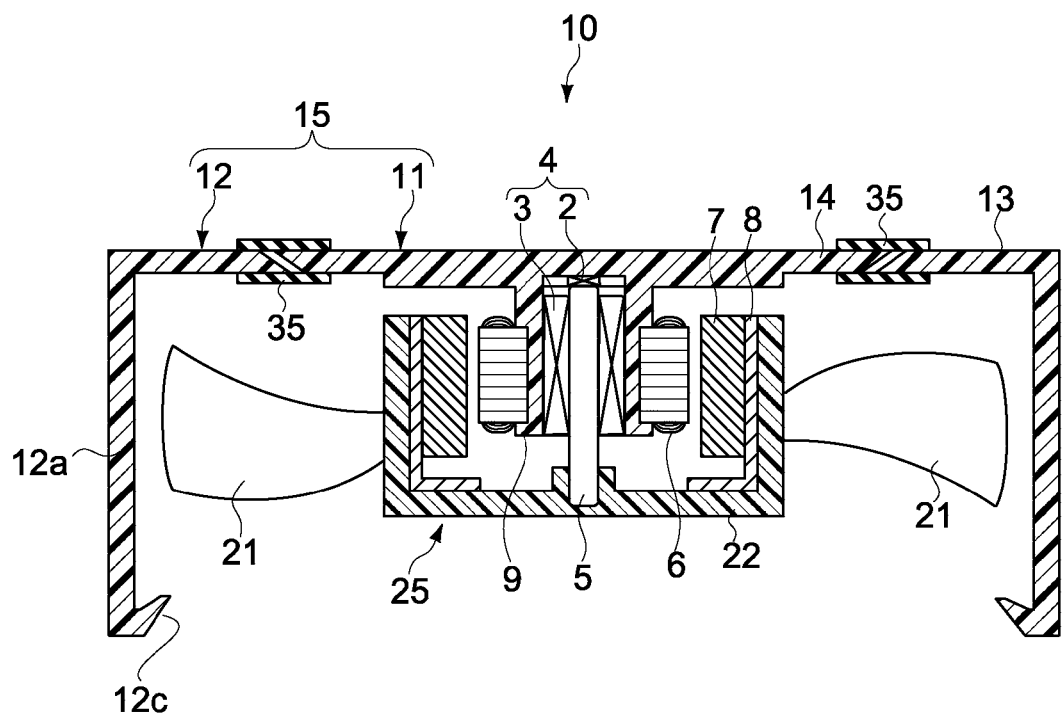
FIG. 2 is a sectional view of the fan motor apparatus shown in FIG. 1.

FIG. 1 is a perspective view showing a fan motor apparatus according to an embodiment of the present invention. FIG. 2 is a sectional view of the fan motor apparatus shown in FIG. 1

The fan motor apparatus, which is denoted by reference numeral 10, includes a rotor 25, a stator 15, and vibration insulation members 35.

The rotor 25 includes a cylindrical boss portion 22, a plurality of blades 21, a rotational shaft 5, a yoke 8, and a magnet 7. The boss portion 22 is provided at the center. The blades 21 are provided around the boss portion 22. The rotational shaft 5 is provided inside the boss portion 22 and serves as a rotational axis. The yoke 8 is mounted to an inner circumferential surface of the boss portion 22. The yoke 8 is made of, for example, iron (including press materials such as SPCC and SPEC, and stainless steel), nickel, silicon steel, soft iron, and permalloy. The magnet 7 is made of, for example, neodymium, iron, boron, a ferritic material, a cobaltic material, and samarium.

The stator 15 includes a rotor supporting mechanism 11 and a housing 12. The rotor supporting mechanism 11 rotatably supports the rotor 25. The housing 12 serves as a supporting member for supporting the rotor supporting mechanism 11. The rotor supporting mechanism 11 includes a bearing portion 4, a bearing holder 9, and a coil 6. The bearing portion 4 rotatably supports the rotational shaft 5. The bearing holder 9 holds the bearing portion 4. The coil 6 is disposed around the bearing holder 9. The rotor supporting mechanism 11 further includes a plurality of outwardly extending ribs (first ribs) 14. The bearing portion 4 includes, for example, a radial bearing 3 and a thrust bearing 2. The thrust bearing 2 is, for example, a pivot bearing or a thrust dynamic pressure bearing. The ribs 14 of the rotor supporting mechanism 11 and the housing 12 are typically made of a resin. They may also be made of aluminum, stainless steel, and other materials.

The stator 15 is capable of regulating the relative movement of the rotor supporting mechanism 11 and the housing 12. Detailed description thereof will be given later.

The number of the ribs 14 of the rotor supporting mechanism 11 herein is four. The number of the ribs 14 may be three, or five or more. The housing 12 includes inwardly extending ribs (second ribs) 13. The number of the ribs 13 corresponds to the number of the ribs 14 of the rotor supporting mechanism 11. Each rib 13 is connected to each rib 14 via the vibration insulation member 35. The rotor supporting mechanism 11 is thus positioned with respect to the housing 12. The housing 12 is, for example, a rectangular parallelepiped including four side walls 12a.

As shown in FIG. 1, the side walls 12a included in the housing 12, the ribs 13, and the ribs 14 form four openings 12b. Each opening 12b serves as an inlet port. As shown in FIG. 2, another opening, which is denoted by reference numeral 12c, is provided to the side of the housing 12 opposite to the side to which the rotor supporting mechanism 11 is disposed. The opening 12c serves as an outlet port. Substantially the entire area of the rectangular opening 12c serves as the outlet port. The shape and the size of the outlet port may be arbitrarily set. Alternatively, the openings 12b may serve as outlet ports and the opening 12c may serve as an inlet port.

In the fan motor apparatus 10, when the coil 6 is energized, the rotor 25 rotates, pressure difference of the air occurs inside the housing 12 owing to the predetermined shape of the blades 21, and the air introduced from the openings 12b being the inlet ports is released from the opening 12c being the outlet port.

Hereinafter, the axial direction (Z direction) of the rotational shaft 5 is referred to as thrust direction. The direction outwardly radiating in the plane (X-Y plane) from the rotational shaft 5 is referred to as radial direction. The X-Y plane is orthogonal to the rotational shaft 5.

Figure 3:
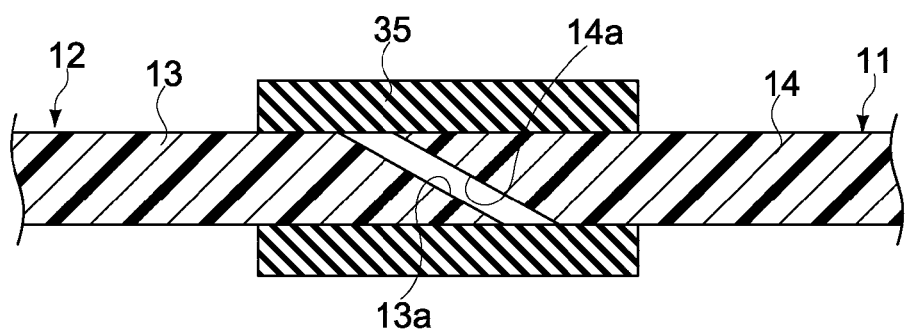
FIG. 3 is an enlarged sectional view showing a vibration insulation member and the vicinity thereof of the fan motor apparatus shown in FIG. 1.

FIG. 3 is an enlarged sectional view showing the vibration insulation member 35 and the vicinity thereof. The vibration insulation member 35 has, for example, a tube shape and is typically made of rubber. The vibration insulation member 35 may be made of any elastic or flexible material which damps mechanical vibration. Since the rib 13 is connected to the rib 14 via the vibration insulation member 35, vibration generated in the rotor supporting mechanism 11 during the rotation of the rotor 25 is prevented from being transmitted to the housing 12. Since the vibration insulation member 35 has a tube shape (rod shape in appearance), the vibration characteristics of the rotor supporting mechanism 11 can be relatively readily regulated. In addition, owing to the tube shape, the thickness of the vibration insulation member 35 does not increase in the thrust direction. The thickness of the fan motor apparatus 10 itself can thus be prevented from increasing in the thrust direction.

Each rib 14 of the rotor supporting mechanism 11 has a tapered surface (first tapered surface) 14a at an end portion thereof. Each rib 13 of the housing 12 has a tapered surface (second tapered surface) 13a at an end portion thereof. The tapered surface 14a opposes the tapered surface 13a. The distance between the tapered surfaces 13a and 14a may be arbitrarily set. Since the tapered surface 14a opposes the tapered surface 13a, in the case that the rotor supporting mechanism 11 or the housing 12 receives an impact from the outside, the tapered surface 14a contacts the tapered surface 13a. The relative movement of the rotor supporting mechanism 11 and the housing 12 is thus regulated.

Even in the case that the ribs 13 and 14 are each cut in the thrust direction and the end surface of the rib 13 opposes the end surface of the rib 14, the relative movement of the rotor supporting mechanism 11 and the housing 12 in the radial direction can be regulated. In this case however, it is difficult to regulate the relative movement in the thrust direction. That is, in this embodiment, both the relative movement of the rotor supporting mechanism 11 and the housing 12 in the thrust direction and the relative movement thereof in the radial direction are regulated. In other words, the relative movement can be minimized as much as possible.

As described above, according to this embodiment, the vibration regulation member 35 can prevent the vibration from being transmitted from the rotor supporting mechanism 11 to the housing 12. In addition, when the fan motor apparatus 10 receives an impact, the rotor supporting mechanism 11 or the housing 12 is prevented from colliding with another member or device. In many past cases, when, for example, a fan motor apparatus is mounted to an electronic apparatus, a space is provided between the fan motor apparatus and a member in the vicinity thereof in order to avoid such a collision. According to this embodiment however, since the relative movement is regulated as described above, it is unnecessary to provide such a space. Accordingly, an electronic apparatus can be downsized.

In this embodiment, the tube-shaped vibration insulation member 35 covers the end portion of the rib 13 and the end portion of the rib 14. In other words, a mechanism for regulating the relative movement is disposed inside the vibration regulation member 35. Accordingly, it is unnecessary to independently provide a mechanism for regulating relative movement. The fan motor apparatus 10 can thus be downsized.

In the fan motor apparatus 10 according to this embodiment, a pivot bearing is particularly useful for the thrust bearing 2 because the pivot bearing is inexpensive. In the case that the pivot bearing is employed as the thrust bearing 2 however, the movement of the rotational shaft 5 in the thrust direction is not regulated in the bearing portion 4 of this embodiment. So the center of the coil 6 in the thrust direction and the center of the magnet 7 in the thrust direction are offset such that the center of the coil 6 in the thrust direction does not coincide with the center of the magnet 7 in the thrust direction. Since the centers do not coincide with each other, a magnetic attractive force is imbalanced. Owing to the generated magnetic attractive force, the rotational shaft 5 is firmly held by the pivot bearing. In this case, magnetic flux density is unbalanced between the upper portion and the lower portion of the coil 6. Then a force generates in the thrust direction with the result that vibration occurs, which is disadvantageous. However, since the vibration insulation members 35 are employed in this embodiment, even though the inexpensive bearing is used, the fan motor apparatus 10 excellent in vibration characteristics can be realized. In other words, owing to the combination of the bearing portion 4 including the radial bearing 3 and the thrust bearing 2 being a pivot bearing and the vibration insulation members 35, the problem of vibration is solved and the cost of the fan motor apparatus 10 is decreased, which are advantageous.

In the past, for example, in order to minimize the attractive force as much as possible to curb the vibration and stable a fan motor apparatus, it is necessary to set the shift amount of the center of a coil and the center of a magnet to be approximately ±100 μm. In this embodiment however, since the vibration insulation members 35 are employed, the greatly increased attractive force is allowable. Thus, even though the shift amount is doubled to be ±200 μm, there is no problem.

Figure 4:
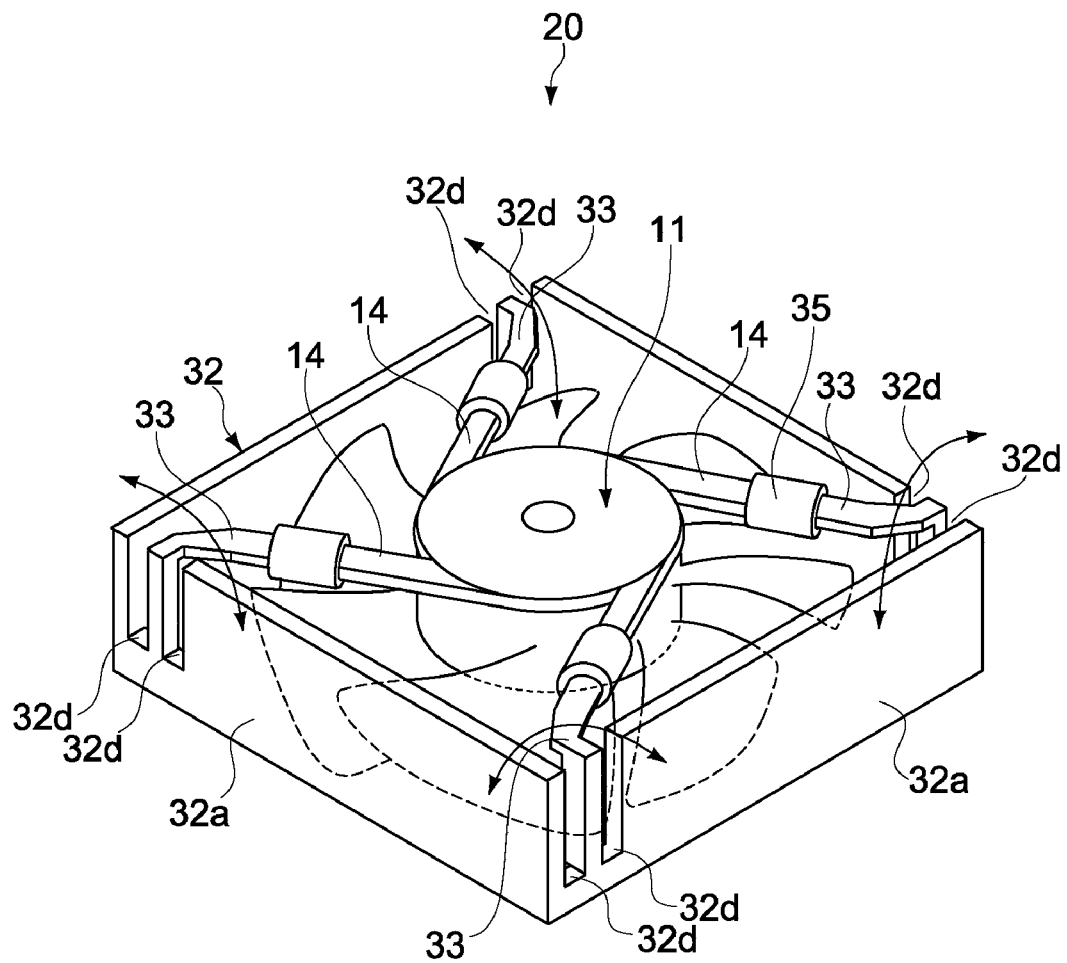
FIG. 4 is a perspective view showing a fan motor apparatus according to another embodiment of the present invention.

FIG. 4 is a perspective view showing a fan motor apparatus according to another embodiment of the present invention. Hereinbelow, members, functions, and so forth similar to those of the fan motor apparatus 10 shown in FIG. 1 to FIG.

3 according to the foregoing embodiment will be briefly described or omitted, and points different therefrom will be mainly described.

The fan motor apparatus, which is denoted by reference numeral 20, includes a housing 32. The housing 32 includes side walls 32a. A rib 33 is extendingly provided to each side wall 32a. The rib 33 is imparted with an elastic force. Typically, two slits 32d are formed in each side wall 32a, and the rib 33 is extendingly provided from a portion between the two slits 32d. Owing to this structure, when the fan motor apparatus 20 is manufactured, an operator can readily connect each rib 14 of the rotor supporting mechanism 11 and each rib 33 of the housing 32 with the vibration insulation member 35.

With regard to the manufacture of the fan motor apparatus 10 shown in FIG. 1, an operator, for example, first deeply inserts one of the rib 13 and the rib 14 in the vibration insulation member 35, positions the rotor supporting mechanism 11 and the housing 12, and then slides the vibration insulation member 35 in the direction of the other one of the rib 13 and the rib 14, to thereby connect the rib 13 of the housing 12 and the rib 14 of the rotor supporting mechanism 11.

Figure 5A:
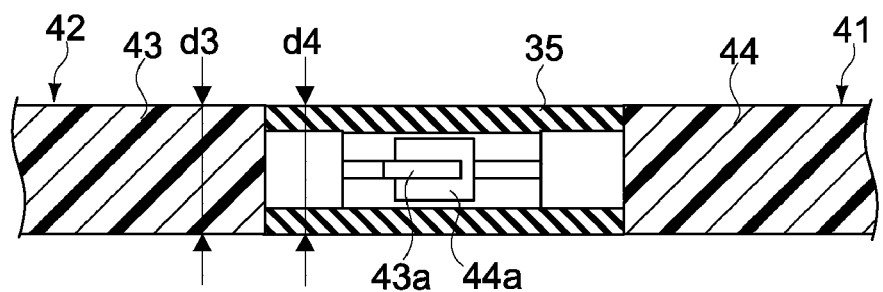
FIG. 5A and FIG. 5B are sectional views showing a portion of a fan motor apparatus according to another embodiment of the present invention, specifically being enlarged sectional views showing a vibration insulation member and the vicinity thereof.
Figure 5B:
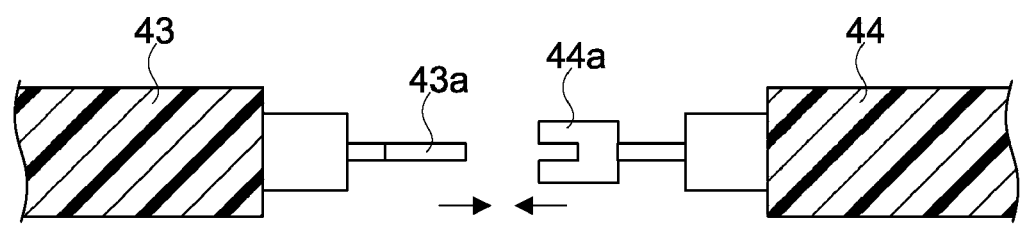

FIG. 5A and FIG. 5B are sectional views showing a portion of a fan motor apparatus according to another embodiment of the present invention, specifically being enlarged sectional views showing a vibration insulation member and the vicinity thereof.

As shown in FIG. 5A, the fan motor apparatus includes a rotor supporting mechanism 41 and a housing 42. The rotor supporting mechanism 41 includes a rib 44. The housing 42 includes a rib 43. The rib 44 includes an engagement piece (first engagement portion) 44a at an end portion thereof. The rib 43 includes an engagement piece (second engagement portion) 43a at an end portion thereof. The engagement piece 44a engages with the engagement piece 43a. The end portion of the rib 44 and the end portion of the rib 43 are covered with the tube-shaped vibration insulation member 35 to thereby be connected similarly to the foregoing embodiments. As shown in FIG. 5B, the two engagement pieces 44a and 43a typically having substantially the same shape, e.g., a squared U shape, are disposed so as to stagger by 90° in the direction of rotation, the longitudinal direction of the ribs 44 and 43 being a rotational axis. The engagement piece 44a can thus engage with the engagement piece 43a. Also in this embodiment, similarly to the foregoing embodiments in which the plurality of ribs 14 and the plurality of ribs 13 are employed, the rotor supporting mechanism 41 includes a plurality of ribs and the housing 42 includes the corresponding number of ribs. Each rib of the rotor supporting mechanism 41 and each rib of the housing 42 constitute a pair. In this embodiment, at least one pair of ribs should be the rib 44 provided with the engagement piece 44a and the rib 43 provided with the engagement piece 43a.

The outer diameter (outer diameter of a portion other than the end portion) d3 of the rib 43 (and the rib 44) and the outer diameter d4 of the vibration insulation member 35 are set substantially the same. As a result, the diameter is kept constant from the rib 43 through the vibration insulation member 35 to the rib 44. That is, the vibration insulation member 35 does not protrude from the surfaces of the ribs 43 and 44. The fan motor apparatus can thus be thinned and downsized.

Since the rib 44 engages with the rib 43 owing to the engagement pieces 44a and 43a as shown in FIG. 5A and FIG. 5B, the relative movement of the rotor supporting mechanism 41 and the housing 42 can be further reliably regulated.

Figure 6:
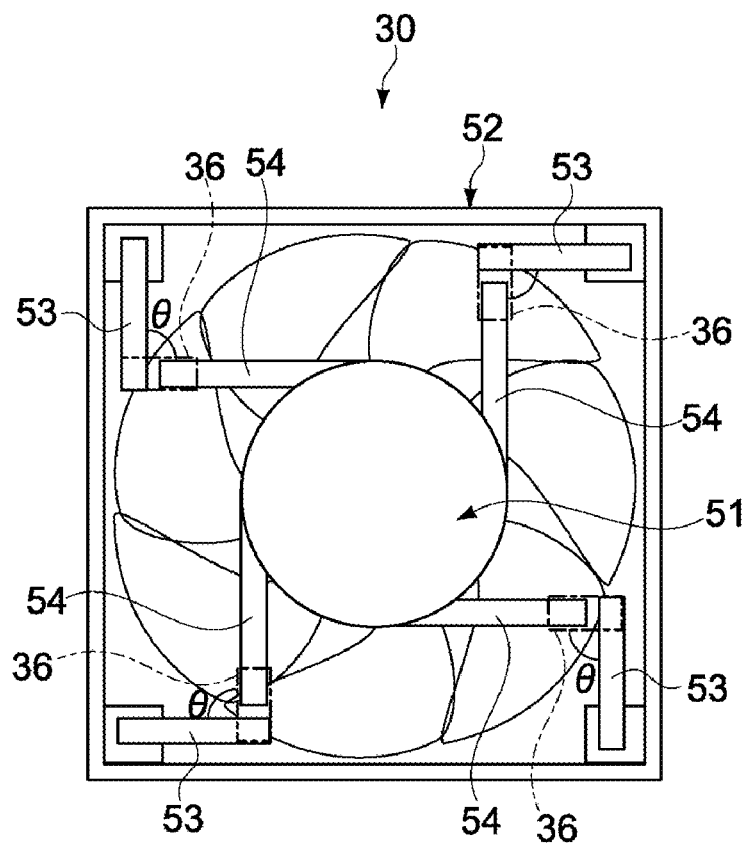
FIG. 6 is a plan view schematically showing a fan motor apparatus according to another embodiment of the present invention.
Figure 7:
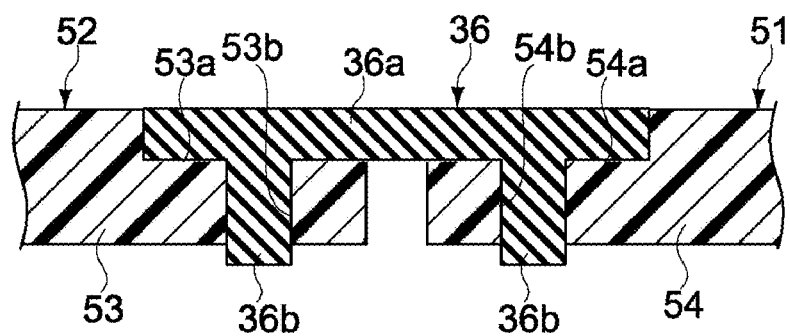
FIG. 7 is an enlarged sectional view showing a vibration insulation member and the vicinity thereof of the fan motor apparatus shown in FIG. 6.

FIG. 6 is a plan view schematically showing a fan motor apparatus according to another embodiment of the present invention. FIG. 7 is an enlarged sectional view showing a vibration insulation member and the vicinity thereof of the fan motor apparatus, which is denoted by reference numeral 30, shown in FIG. 6.

The fan motor apparatus 30 includes a rotor supporting mechanism 51 and a housing 52. The rotor supporting mechanism 51 supports the rotor 25. The housing 52 supports the rotor supporting mechanism 51. The rotor supporting mechanism 51 includes ribs 54. The housing 52 includes ribs 53. Each rib 54 is connected to each rib 53 with a vibration insulation member 36, and they are positioned by the angle θ, i.e., 90° in FIG. 6. The angle θ is not limited to 90°. As shown in FIG. 7, the vibration insulation member 36 includes a base portion 36a and projection portions 36b, the number of which is, for example, two. The number of the projection portions 36b is not limited to two, but three or more projection portions 36b may be provided.

The rib 54 of the rotor supporting mechanism 51 includes a stepped portion 54a at an end portion thereof. The stepped portion 54a is lower by one step than the upper surface of the rib 54. The stepped portion 54a is provided with a hole 54b into which one projection portion 36b is fit-inserted. The hole 54b herein is a through hole, but may not be a through hole depending on the length of the projection portion 36b. The rib 53 of the housing 52 has the same configuration at an end portion thereof as the rib 54. That is, the rib 53 includes a stepped portion 53a at the end portion. The stepped portion 53a is formed with a hole 53b into which another one projection portion 36b is fit-inserted. Also according to this embodiment, the vibration can be prevented from being transmitted from the rotor supporting mechanism 51 to the housing 52, and the relative movement of the rotor supporting mechanism 51 and the housing 52 can be reliably regulated.

Figure 8:
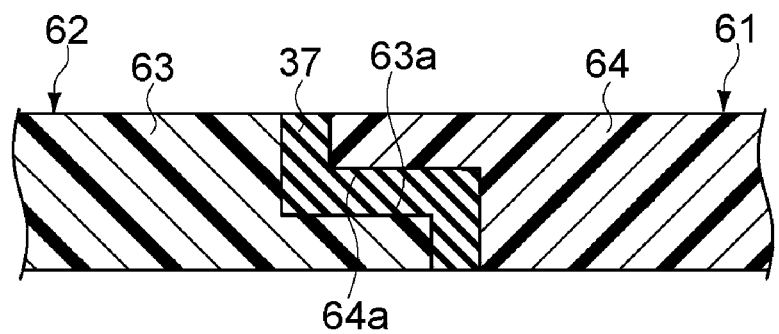
FIG. 8 is a sectional view showing a portion of a fan motor apparatus according to another embodiment of the present invention, specifically being an enlarged sectional view showing a vibration insulation member and the vicinity thereof.

FIG. 8 is a sectional view showing a portion of a fan motor apparatus according to another embodiment of the present invention, specifically being an enlarged sectional view showing a vibration insulation member and the vicinity thereof. A rotor supporting mechanism 61 includes a rib 64. The rib 64 is formed with a stepped portion 64a at an end portion thereof. A housing 62 includes a rib 63. The rib 63 is formed with a stepped portion 63a. The stepped portion 63a opposes the stepped portion 64a of the rib 64. There is provided a vibration insulation member 37 between the end portion of the rib 64 and the end portion of the rib 63 such that a gap formed between those end portions is sealed. The vibration insulation member 37 is fixed to each of the end portion of the rib 64 and the end portion of the rib 63 with an adhesive, a screw, or the like.

Figure 9:
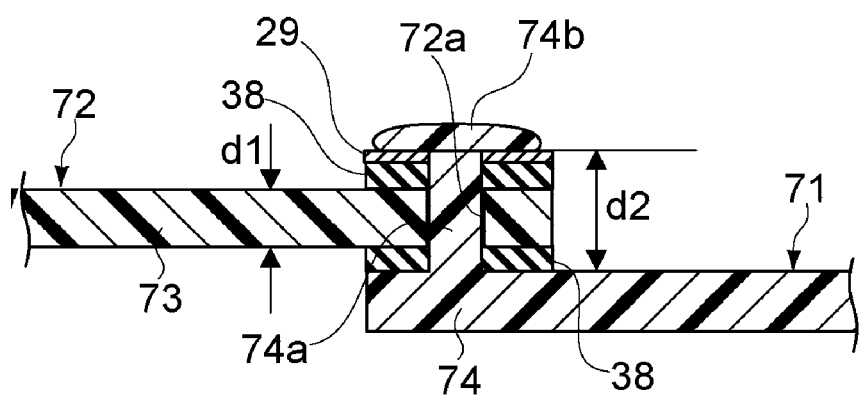
FIG. 9 is a sectional view showing a portion of a fan motor apparatus according to another embodiment of the present invention, specifically being an enlarged sectional view showing a vibration insulation member and the vicinity thereof.

FIG. 9 is a sectional view showing a portion of a fan motor apparatus according to another embodiment of the present invention, specifically being an enlarged sectional view showing a vibration insulation member and the vicinity thereof. A rotor supporting mechanism 71 includes a rib 74. The rib 74 is provided with a protrusion (first engagement portion) 74a at an end portion thereof. A housing 72 includes a rib 73. The rib 73 is provided with a hole (second engagement portion) 72a at an end portion thereof. The protrusion 74a engages with the hole 72a. The thickness d1 of the rib 73 is set smaller than the length d2 of the protrusion 74a. Around the protrusion 74a, two ring-shaped vibration insulation members 38 and a washer 29 are provided. One of the insulation members 38 is fitted between the rib 73 and the rib 74. The other one of the insulation members 38 and the washer 29 is fitted between the rib 73 and a head portion 74b of the protrusion 74a. The washer 29 is required in order to thermally caulk the protrusion 74a and the head portion 74b in the case of, for example, connecting the rib 74 to the rib 73 when the fan motor apparatus is manufactured.

Figure 20:
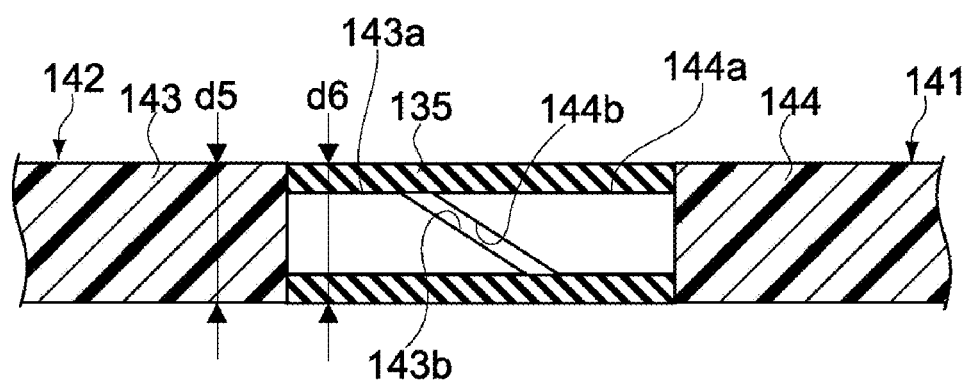
FIG. 20 is a sectional view showing a portion of a fan motor apparatus according to another embodiment of the present invention, specifically being an enlarged sectional view showing a vibration insulation member and the vicinity thereof.

FIG. 20 is a sectional view showing a portion of a fan motor apparatus according to another embodiment of the present invention, specifically being an enlarged sectional view showing a vibration insulation member and the vicinity thereof.

A rotor supporting mechanism 141 includes a rib 144. The rib 144 includes a stepped portion 144a at an end portion thereof. The stepped portion 144a has a diameter smaller than the diameter of the rib 144. In addition, the stepped portion 144a is formed with a tapered surface 144b. Similarly, a housing 142 includes a rib 143. The rib 143 includes a stepped portion 143a at an end portion thereof. The stepped portion 143a includes a tapered surface 143b. The tapered surface 143b opposes the tapered surface 144b. Owing to the ribs 144 and 143 thus structured, the same effect as the effect obtained by the ribs 14 and 13 as shown in, for example, FIG. 3 can be obtained.

The outer diameter (outer diameter of a portion other than the end portion) d5 of the rib 144 (and the rib 143) and the outer diameter d6 of a vibration insulation member 135 connecting the ribs 144 and 143 are set substantially the same. Owing to the ribs 144 and 143 thus structured, the same effect as the effect obtained by the ribs 44 and 43 as shown in FIG. 5 can be obtained.

Figure 10:
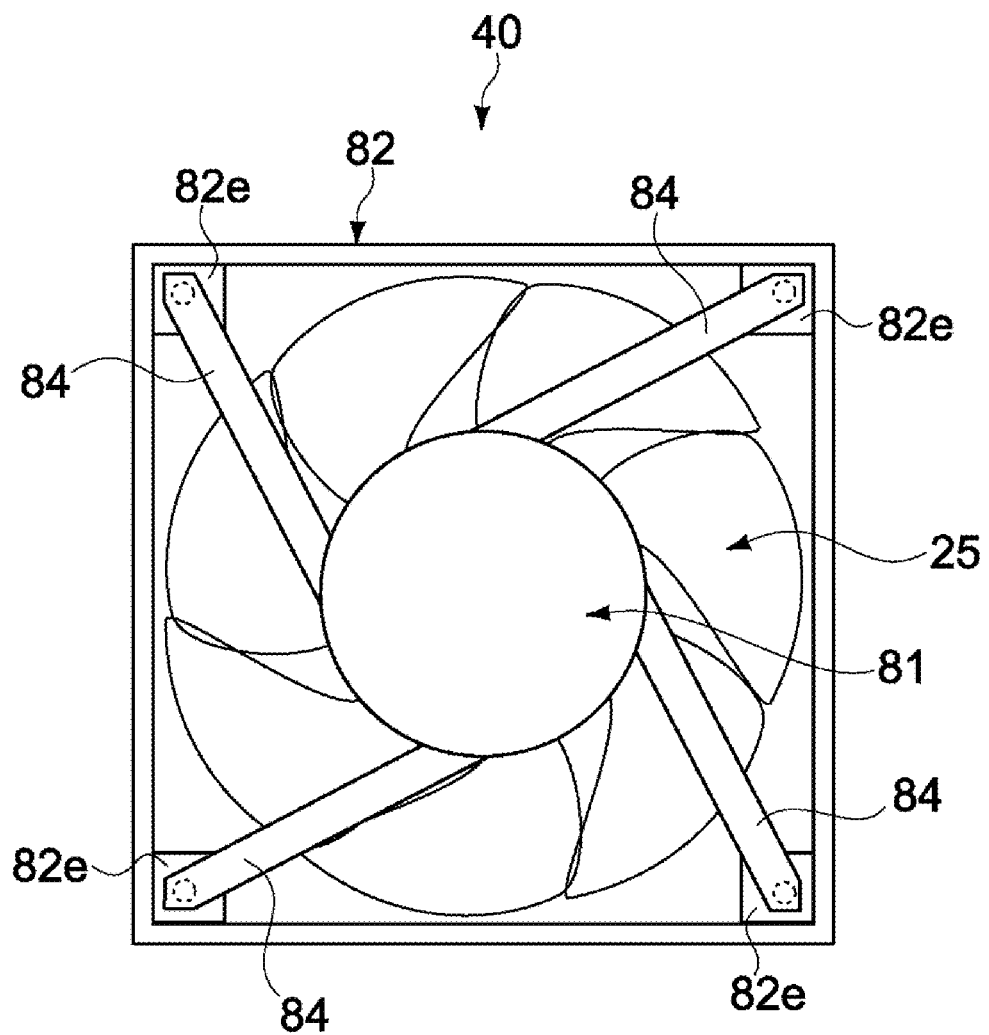
FIG. 10 is a plan view schematically showing a fan motor apparatus according to another embodiment of the present invention.
Figure 11:
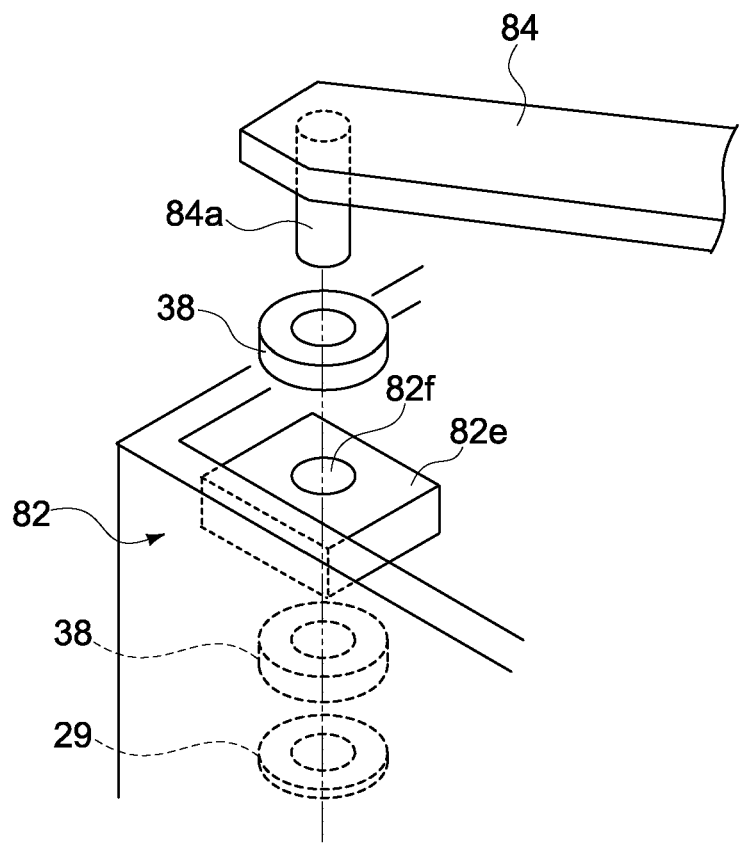
FIG. 11 is an enlarged perspective view schematically showing a vibration insulation member and the vicinity thereof of the fan motor apparatus shown in FIG. 10.
Figure 12:
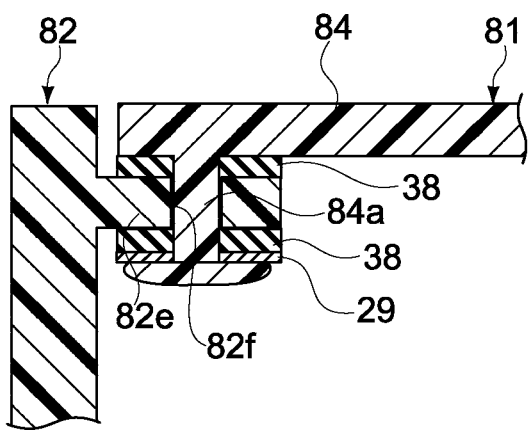
FIG. 12 is an enlarged sectional view showing the vibration insulation member and the vicinity thereof shown in FIG. 11.

FIG. 10 is a plan view schematically showing a fan motor apparatus according to another embodiment of the present invention. FIG. 11 is an enlarged perspective view schematically showing a vibration insulation member and the vicinity thereof of the fan motor apparatus, which is denoted by reference numeral 40, shown in FIG. 10. FIG. 12 is an enlarged sectional view showing the vibration insulation member and the vicinity thereof shown in FIG. 11.

The fan motor apparatus 40 according to this embodiment includes a rotor supporting mechanism 81 and a housing 82. The rotor supporting mechanism 81 includes ribs 84. Each rib 84 is provided with a protrusion (first engagement portion) 84a at an end portion thereof. The housing 82 is provided with pedestals (second engagement portions) 82e at predetermined portions, i.e., corner portions, thereof. Each protrusion 84a engages with each pedestal 82e. That is, the housing 82 is not provided with a rib. Each pedestal 82e is formed with a hole 82f into which the protrusion 84a is fit-inserted. Around the protrusion 84a, the vibration insulation members 38 and the washer 29 are provided. One of the insulation members 38 is fitted between the rib 84 and the pedestal 82e. Another one of the insulation members 38 and the washer 29 is fitted between the pedestal 82e and a head portion of the protrusion 84a. Similarly to the foregoing embodiment as shown in FIG. 9, the protrusion 84a and the head portion are thermally caulked.

Figure 13:
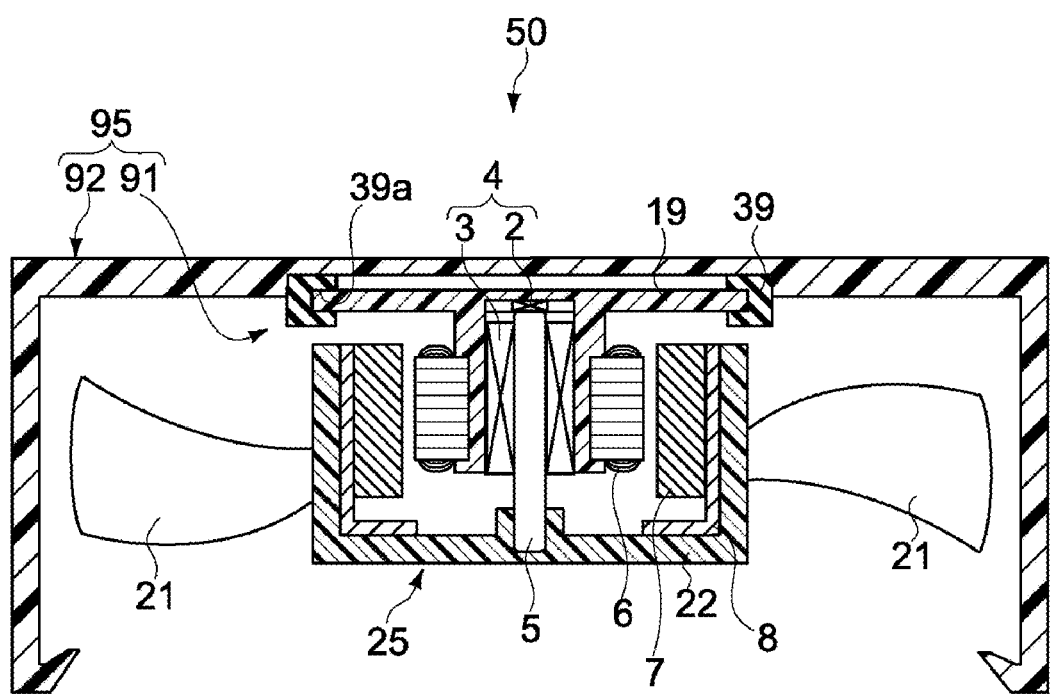
FIG. 13 is a sectional view showing a fan motor apparatus according to another embodiment of the present invention.

FIG. 13 is a sectional view showing a fan motor apparatus according to another embodiment of the present invention.

The fan motor apparatus, which is denoted by reference numeral 50, according to this embodiment includes the rotor 25 and a stator 95. The stator 95 includes a rotor supporting mechanism 91 and a housing 92. The rotor supporting mechanism 91 includes a bearing holder 19. The bearing holder 19 holds the bearing portion 4. The fan motor apparatus 50 includes a vibration insulation member 39 such that the vibration insulation member 39 is partly sandwiched between the bearing holder 19 and the housing 92. The vibration insulation member 39 in this case has a ring shape, but the shape thereof is not limited to this. The vibration insulation member 39 is provided with a ring-like groove 39a. Into the groove 39a, an outer peripheral portion of the bearing holder 19 is fit-inserted. The configuration of the rotor 25 of the fan motor apparatus 50 is substantially the same as the configuration of the rotor 25 of the fan motor apparatus 10 shown in FIG. 2.

Since the vibration insulation member 39 is partly sandwiched between the bearing holder 19 and the housing 92 as described above, the fan motor apparatus 50 can obtain the same function and effect as those of the fan motor apparatuses according to the foregoing embodiments.

A motor portion of the fan motor apparatus 10, 20, 30, 40, 50 (including the fan motor apparatus having the structure shown in FIG. 5A and FIG. 5B, FIG. 8, FIG. 9, FIG. 20) according to each of the foregoing embodiments typically employs a three-phase motor. The motor portion may employ, as a matter of course, a single-phase motor or a motor having five or more phases. There is no limitation to the number of pole teeth of the coil 6 and the number of poles of the magnet 7. Exemplified combination thereof are "nine pole teeth and eight poles" and "nine pole teeth and twelve poles". In the case of the combination of "nine pole teeth and eight poles", regarding the number of cogging and switching frequency resulting in vibration, the number of cogging is typically 8n, 9n, 24n, 72n, or the like (n is a natural number). In general, the three-phase motor is excellent in start characteristics and rotates smoothly compared to the single-phase motor and so forth. However, the frequency of the vibration source of the three-phase motor is higher than the frequency of the vibration source of the single-phase motor or the like. So, the three-phase motor is likely to cause resonance problem in the case that members having various characteristics frequencies are in the vicinity thereof. However, in the foregoing embodiments, owing to the vibration insulation members 35 to 39 and 135, reliable start characteristics and smooth rotation are attained even in the case of using the three-phase motor. In addition, the resonance problem is reliably solved. Thus, the motor obtained in each of the foregoing embodiments hardly generates noise in any environment.

Up to now, the inventors of the present patent application have devised magnetization such as sine magnetization and skew magnetization of a magnet of a three-phase motor in order to reduce cogging, and have studied an energization waveform to attain a sine waveform in order to reduce vibration due to switching. In the fan motor apparatus 10, 20, 30, 40, 50 according to each of the foregoing embodiments, however, it is unnecessary to pay attention to magnetization and so forth. The problem of vibration can be solved as long as the energization waveform is a substantially trapezoidal waveform.

Figure 14:
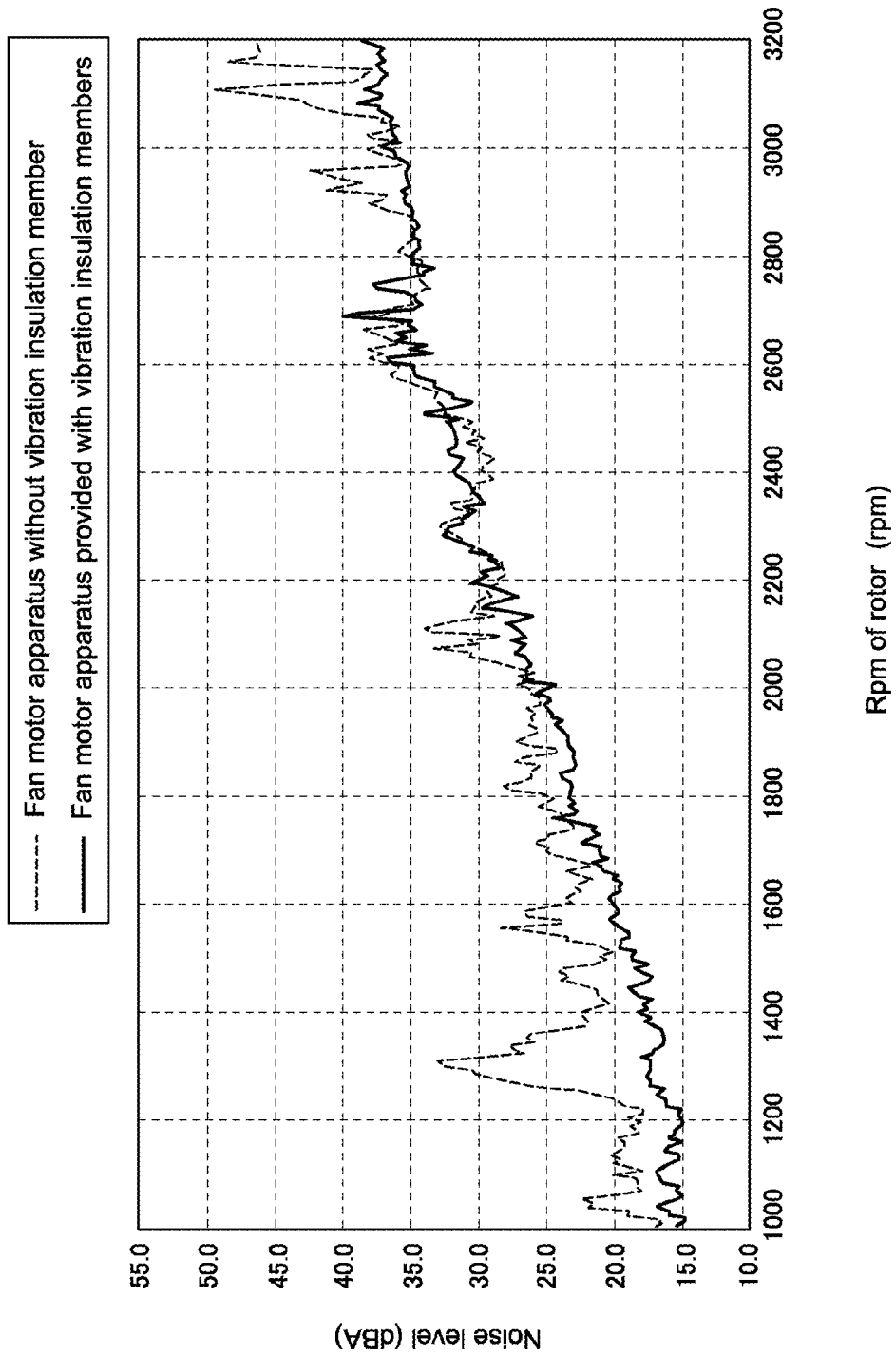
FIG. 14 is a graph showing noise levels of the fan motor apparatus provided with the vibration insulation members as shown in FIG. 1 and FIG. 2, and noise levels of a fan motor apparatus without a vibration insulation member.

FIG. 14 is a graph showing noise levels of the fan motor apparatus provided with the vibration insulation members as shown in FIG. 1 and FIG. 2, and noise levels of a fan motor apparatus without a vibration insulation member. The abscissa axis shows rpm of a rotor. Each fan motor apparatus employed a motor portion employing a three-phase motor (having nine pole teeth and eight poles). In the experiment conducted by the inventors of the present patent application, the noise levels of the fan motor apparatus 10 shown in FIG. 1 and FIG. 2 and the noise levels of a fan motor apparatus which is substantially the same device as the fan motor apparatus 10 but is not provided with a movement regulator of the relative movement of the rotor supporting mechanism 11 and the housing 12 were actually measured. FIG. 14 shows the result of the experiment.

As shown in the graph of FIG. 14, the noise levels of the fan motor apparatus provided with the vibration insulation members are lower than the noise levels of the fan motor apparatus without a vibration insulation member in substantially the entire rpm region.

Figure 15:
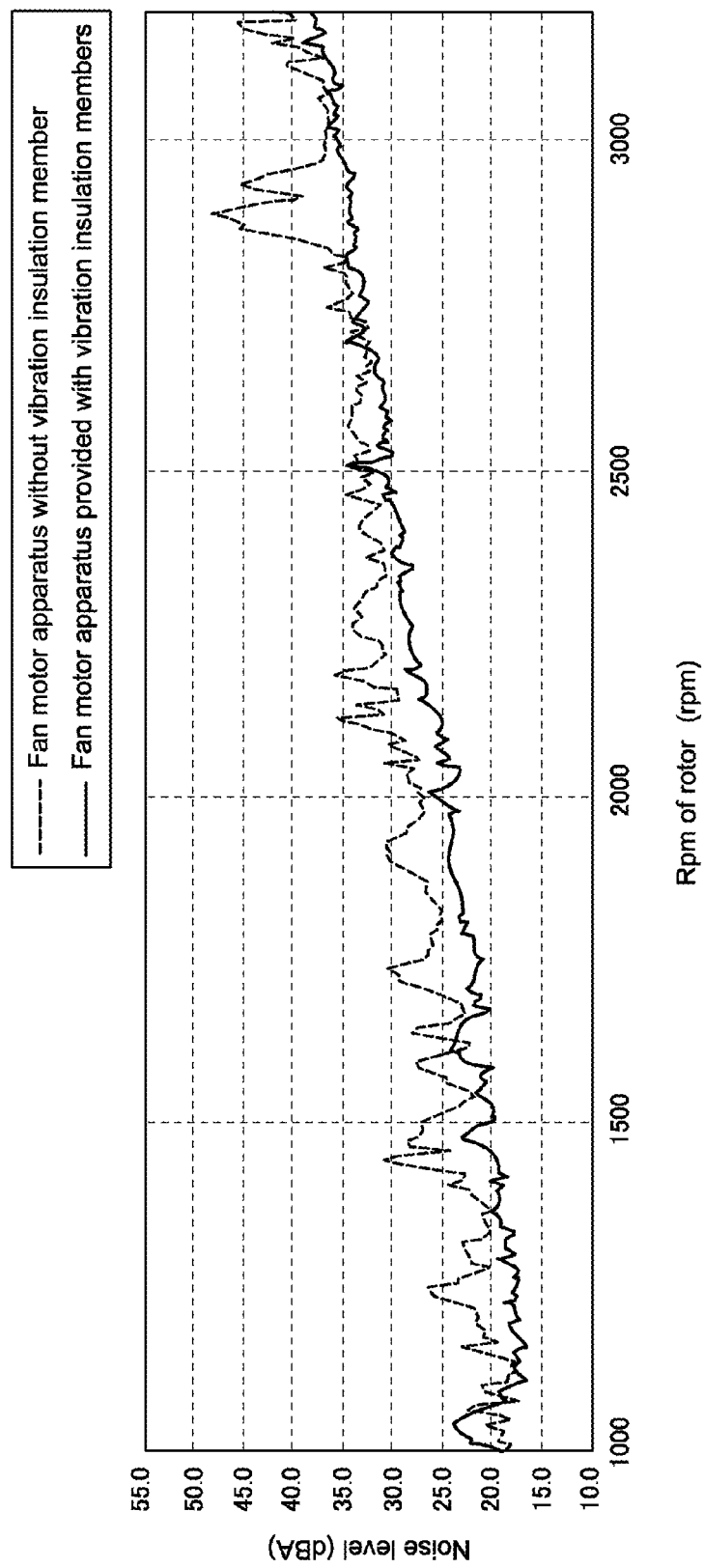
FIG. 15 is a graph showing noise levels of a fan motor apparatus provided with vibration insulation members shown in FIG. 16, and noise levels of another fan motor apparatus without a vibration insulation member.
Figure 16:
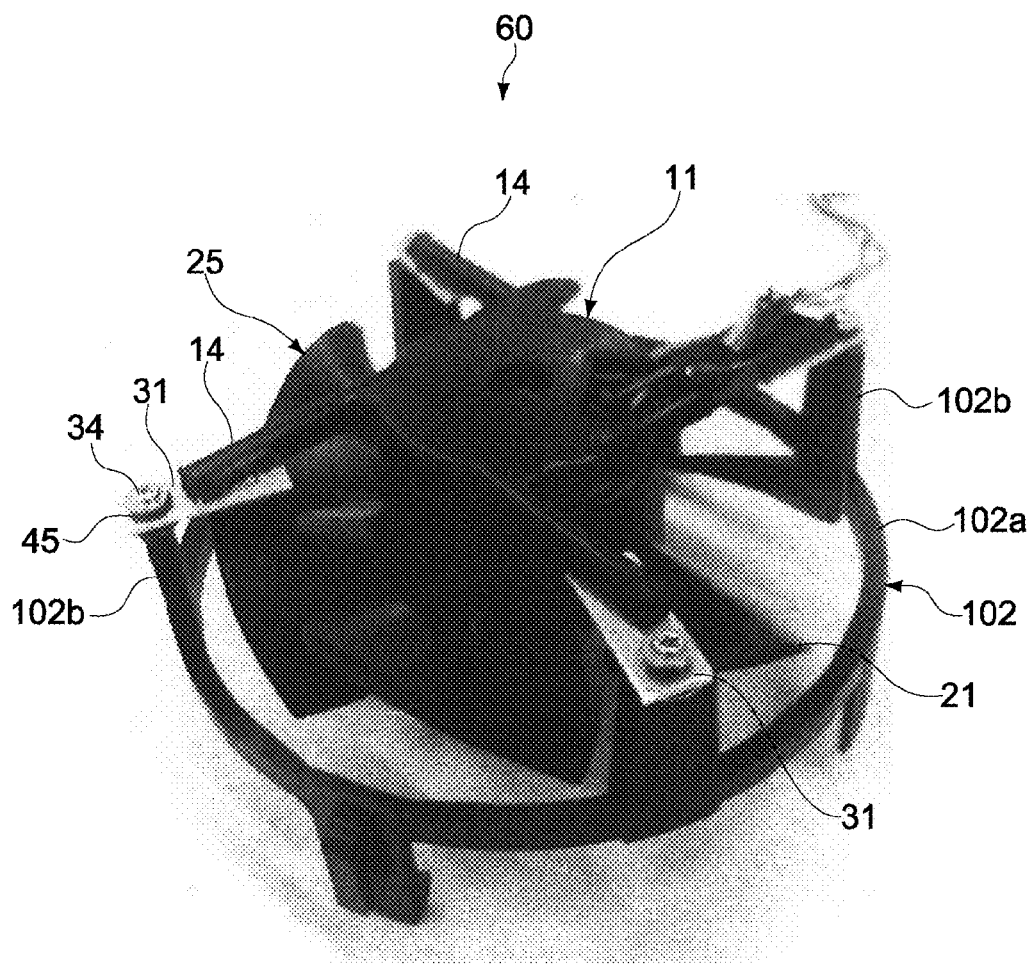
FIG. 16 is a photograph of the fan motor apparatus, which is according to another embodiment of the present invention.

FIG. 16 is a photograph of a fan motor apparatus provided with vibration insulation members according to another embodiment of the present invention. FIG. 15 is a graph showing noise levels of the fan motor apparatus, which is denoted by reference numeral 60, shown in FIG. 16, and noise levels of a fan motor apparatus which is substantially the same device as the fan motor apparatus 60 but is not provided with a vibration insulation member.

The fan motor apparatus 60 shown in the picture of FIG. 16 includes the rotor supporting mechanism 11 including the ribs 14. A metal plate 31 is fixed to the end portion of each rib 14. The rotor supporting mechanism 11 is supported by a frame 102. The frame 102 includes a ring-shaped member 102a and column members 102b. The column members 102b are vertically provided to the ring-shaped member 102a. The metal plate 31 is mounted to each column member 102b through a screw 34, a washer, a vibration insulation member 45, and so forth. It should be noted that the frame 102 may usually be mounted with a housing (not shown).

As shown in the graph of FIG. 15, the noise levels of the fan motor apparatus 60 provided with the vibration insulation members 45 as shown in FIG. 16 are lower than the noise levels of the fan motor apparatus without a vibration insulation member in substantially the entire rpm region of the rotor 25.

Figure 17:
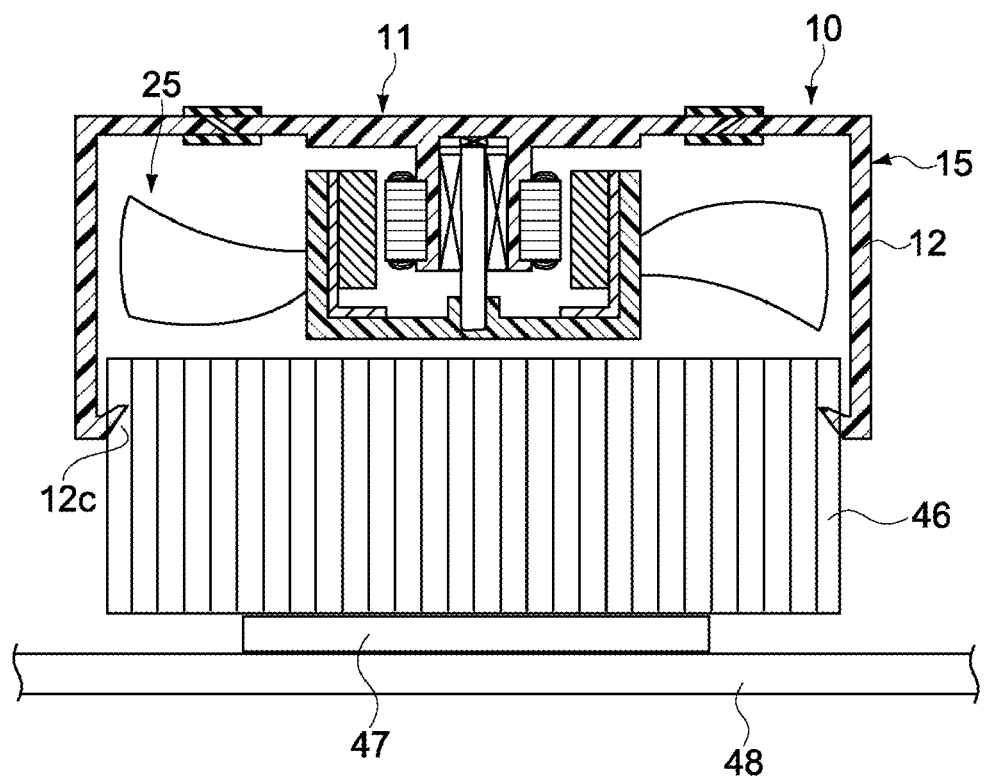
FIG. 17 is a view showing the state that the fan motor apparatus shown in FIG. 2 is mounted with a heat sink and so forth.

FIG. 17 is a view showing the state that a heat sink, which is denoted by reference numeral 46, and so forth are mounted to a fan motor apparatus, in this case the fan motor apparatus 10 shown in FIG. 2. Typically, the heat sink 46 is mounted to the opening 12c being an outlet port of the housing 12 of the fan motor apparatus 10. The heat sink 46 is mounted with an IC 47, which is a CPU or the like mounted to a substrate 48, at an outlet side thereof. In other words, the fan motor apparatus 10 sends air to heat generators including the heat sink 46 and the IC 47 to cool them down.

It should be noted that the fan motor apparatus 10 shown in FIG. 2 is exemplarily employed in FIG. 17. Also, heat generators may be mounted to the fan motor apparatus 20, 30, 40, 50, 60 (including the fan motor apparatus having the structure shown in FIG. 5A and FIG. 5B, FIG. 8, FIG. 9, FIG. 20) according to each of the foregoing embodiments.

Figure 18:
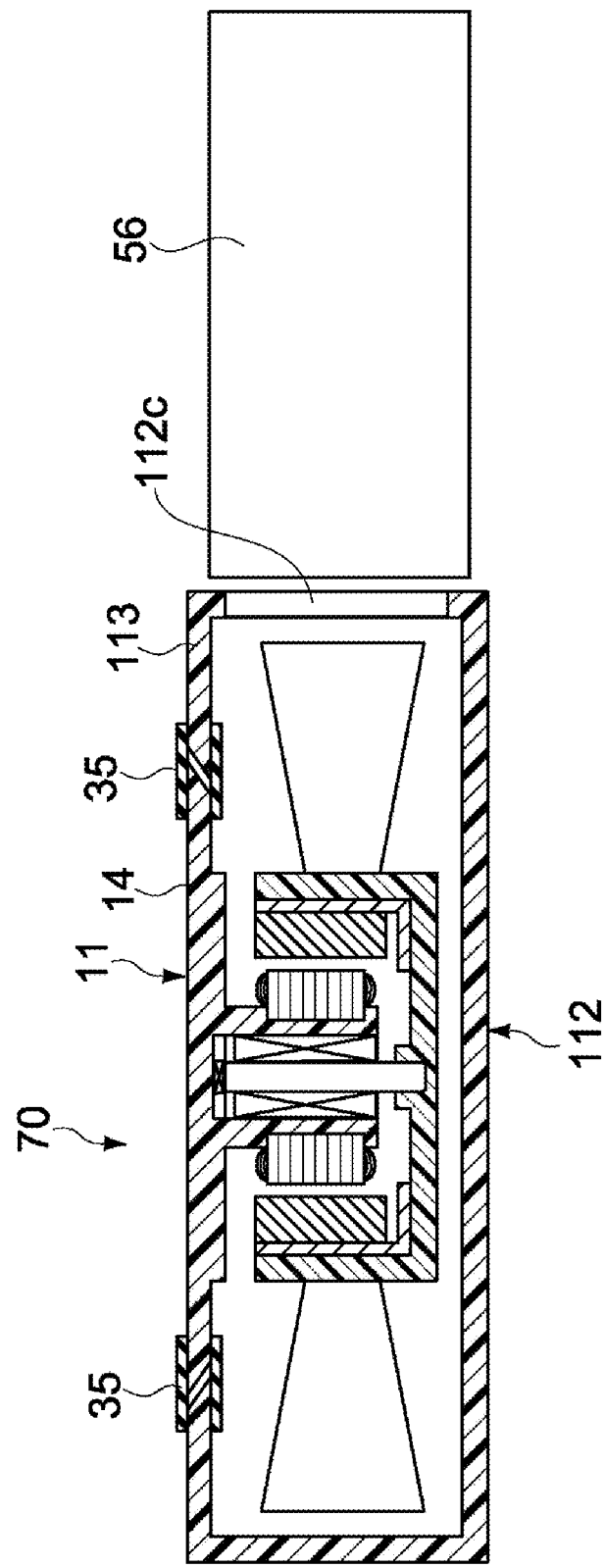
FIG. 18 is a sectional view showing a fan motor apparatus according to another embodiment of the present invention and a heat sink.

FIG. 18 is a sectional view showing a fan motor apparatus according to another embodiment of the present invention and a heat sink. The fan motor apparatus, which is denoted by reference numeral 70, has substantially the same structure as the structure of the fan motor apparatus 10 shown in FIG. 2. The rib 14 of the rotor supporting mechanism 11 is connected to a rib 113 of a housing 112 via the vibration insulation member 35.

While the fan motor apparatus 10 employs an axial fan, the fan motor apparatus 70 employs a centrifugal fan. In other words, the housing 112 includes an outlet port 112c at a side surface thereof. A heat sink 56 is cooled down by the air released from the outlet port 112c.

Figure 19:
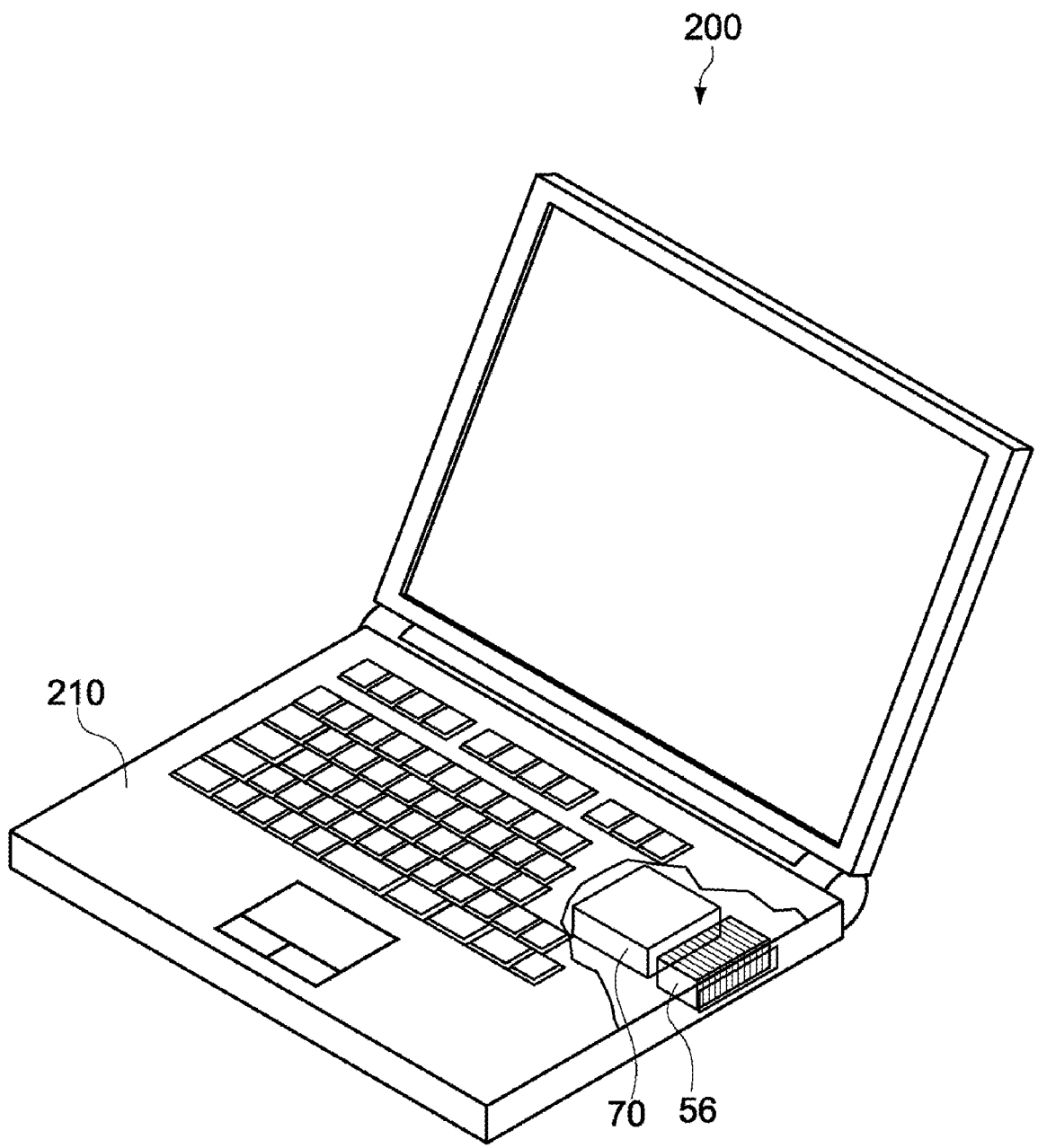
FIG. 19 is a perspective view showing a laptop personal computer being an electronic apparatus mounted with the fan motor apparatus shown in FIG. 18.

FIG. 19 is a perspective view showing a laptop PC (personal computer) being an electronic apparatus to which the fan motor apparatus 70 is mounted. The PC, which is denoted by reference numeral 200, includes a case 210. The case 210 accommodates therein the fan motor apparatus 70 and the heat sink 56. The heat sink 56 is at least thermally connected with a CPU or the like via a heat pipe or the like.

The embodiments of the present invention are not limited to the embodiments as described above. Other various embodiments can be employed.

For example, while the housing is a rectangular parallelepiped in each of the aforementioned embodiments, the housing may be a cylinder or the like. The shape, size, position, and the like of each member or the like other than the housing included in the fan motor apparatus may be arbitrarily changed. The vibration insulation member may be disposed to the inner side or the outer side in the radial direction of the fan motor apparatus.

It should be understood by those skilled in the art that various modifications, combinations, sub-combinations and alterations may occur depending on design requirements and other factors insofar as they are within the scope of the appended claims or the equivalents thereof. For example, one characteristic portion of the fan motor apparatus 10, 20, 30, 40, 50, 60, 70 (including the fan motor apparatus having the structure shown in FIG. 5A and FIG. 5B, FIG. 8, FIG. 9, FIG. 20) according to each of the foregoing embodiments may be combined with another one characteristic portion thereof, to thereby obtain a fan motor apparatus of a different mode.

In FIG. 19, the laptop PC 200 is exemplarily employed as an electronic apparatus to which the fan motor apparatus is mounted. The fan motor apparatus according to each of the foregoing embodiments may also be mounted to, as a matter of course, another electronic apparatus such as a desktop PC. A fan motor apparatus employing an axial fan such as the fan motor apparatus 10 shown in FIG. 1 etc. may usually be mounted to a desktop PC. The fan motor apparatus according to each of the foregoing embodiments may also be mounted to another electronic apparatus such as a camera, a display device, an audio-visual device, a projector, a game device, a car navigation device, a robot device, and other electronic appliances.

The heat generator refers to not only the heat sink or the IC, but also any member which generates heat such as a heat radiating portion of a heat pipe, a lamp for a projector (or a member in the vicinity of the lamp), or other electronic components.

What is claimed is:

1. A fan motor apparatus, comprising:
a rotor including a blade secured thereto;
a stator including a rotor supporting mechanism rotatable supporting the rotor;
a supporting member supporting the rotor supporting mechanism; and
a vibration insulation member provided between the rotor supporting mechanism and the supporting member,
wherein,
the stator being is capable of regulating relative movement between the rotor supporting mechanism and the supporting member,
the rotor supporting mechanism includes at least one first rib extending therefrom toward the supporting member,
the support member includes at least one second rib extending therefrom toward the rotor supporting mechanism,
the first and second ribs are separate members,
the vibration insulation member is between the first and second ribs and is secured to each of the first and second ribs,
the support member has one or more walls that surround the rotor and stator,
the stator is supported and located at a first end of the walls with the rotor suspended therefrom so as to be positioned between the first end and a second end of the one or more walls, the second ribs extend from the first end of the one or more walls, a rotor includes a blade secured thereto, the first rib has an end portion with a first tapered surface, and the second rib has end portion with a second tapered surface, the second tapered surface opposes the first tapered surface, and the vibration insulation member is a tube-shaped member connecting the end portion of the first rib and the end portion of the second rib.

2. The fan motor apparatus as set forth in claim 1, wherein the first rib is elastically provided to the rotor supporting mechanism.

3. The fan motor apparatus as set forth in claim 1, wherein the second rib is elastically provided to the supporting member.

4. A fan motor apparatus, comprising:

a rotor including a blade secured thereto;

a stator including a rotor supporting mechanism rotatably supporting the rotor;

a supporting member supporting the rotor supporting mechanism; and a vibration insulation member provided between the rotor supporting mechanism and the supporting member, wherein the stator being is capable of regulating relative movement between the rotor supporting mechanism and the supporting member, the rotor supporting mechanism includes at least one first rib extending therefrom toward the supporting member, the support member includes at least one second rib extending therefrom toward the rotor supporting mechanism, the first and second ribs are separate members, the vibration insulation member is between the first and second ribs and is secured to each of the first and second ribs, the support member has one or more walls that surround the rotor and stator, the stator is supported and located at a first end of the walls with the rotor suspended therefrom so as to be positioned between the first end and a second end of the one or more walls, the second ribs extend from the first end of the one or more walls, the first rib includes a first engagement portion, and the second rib includes a second engagement portion engaged with the first engagement portion.

5. A fan motor apparatus, comprising:

a rotor including a blade secured thereto;

a stator including a rotor supporting mechanism rotatable supporting the rotor;

a supporting member supporting the rotor supporting mechanism; and a vibration insulation member provided between the rotor supporting mechanism and the supporting member, wherein, the stator being is capable of regulating relative movement between the rotor supporting mechanism and the supporting member, the rotor supporting mechanism includes at least one first rib extending therefrom toward the supporting member, the support member includes at least one second rib extending therefrom toward the rotor supporting mechanism, the first and second ribs are separate members, the vibration insulation member is between the first and second ribs and is secured to each of the first and second ribs, the support member has one or more walls that surround the rotor and stator, the stator is supported and located at a first end of the walls with the rotor suspended therefrom so as to be positioned between the first end and a second end of the one or more walls, the second ribs extend from the first end of the one or more walls, the first rib, includes a first engagement portion, second rib includes a second engagement portion engaged with the first engagement portion, and the vibration insulation member is a tube-shaped member connecting the first rib and the second rib such that the first engagement portion and the second engagement portion are covered.

6. A fan motor apparatus, comprising:

a rotor including a blade secured thereto;

a stator including a rotor supporting mechanism rotatably supporting the rotor;

a supporting member supporting the rotor supporting mechanism; and a vibration insulation member provided between the rotor supporting mechanism and the supporting member, wherein the stator being is capable of regulating relative movement between the rotor supporting mechanism and the supporting member, the rotor supporting mechanism includes at least one first rib extending therefrom toward the supporting member, the support member includes at least one second rib extending therefrom toward the rotor supporting mechanism, the first and second ribs are separate members, the vibration insulation member is between the first and second ribs and is secured to each of the first and second ribs, the support member has one or more walls that surround the rotor and stator, the stator is supported and located at a first end of the walls with the rotor suspended therefrom so as to be positioned between the first end and a second end of the one or more walls, the second ribs extend from the first end of the one or more walls, the first rib has an end portion, the second rib has an end portion connected to the end portion of the first rib through the vibration insulation member, and the vibration insulation member is provided such that a gap formed between the end portion of the first rib and the end portion of the second rib is sealed.

* * * * *

UNITED STATES PATENT AND TRADEMARK OFFICE
CERTIFICATE OF CORRECTION

| | | |
|---|---|---|
| PATENT NO. | : 7,885,065 B2 | Page 1 of 1 |
| APPLICATION NO. | : 12/017675 | |
| DATED | : February 8, 2011 | |
| INVENTOR(S) | : Sachiko Kaneko et al. | |

It is certified that error appears in the above-identified patent and that said Letters Patent is hereby corrected as shown below:

On the face page of the patent:

(75) Inventors: "Sachiko Kaneko, Chba (JP)"

should be

(75) Inventors: --Sachiko Kaneko, Chiba (JP)--

Signed and Sealed this
Nineteenth Day of April, 2011

David J. Kappos
*Director of the United States Patent and Trademark Office*